(12) United States Patent
Kim et al.

(10) Patent No.: US 9,661,759 B2
(45) Date of Patent: May 23, 2017

(54) PRINTED CIRCUIT BOARD AND METHOD OF MANUFACTURING THE SAME

(71) Applicant: LG INNOTEK CO., LTD., Seoul (KR)

(72) Inventors: Ji Su Kim, Seoul (KR); Ki Do Chun, Seoul (KR); Kyu Won Lee, Seoul (KR); Sang Myung Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 123 days.

(21) Appl. No.: 14/383,365

(22) PCT Filed: Feb. 25, 2013

(86) PCT No.: PCT/KR2013/001477
§ 371 (c)(1),
(2) Date: Sep. 5, 2014

(87) PCT Pub. No.: WO2013/133560
PCT Pub. Date: Sep. 12, 2013

(65) Prior Publication Data
US 2015/0062846 A1    Mar. 5, 2015

(30) Foreign Application Priority Data
Mar. 7, 2012  (KR) .................. 10-2012-0023253

(51) Int. Cl.
*H05K 1/18*  (2006.01)
*H05K 3/46*  (2006.01)
(Continued)

(52) U.S. Cl.
CPC ......... *H05K 3/4602* (2013.01); *H05K 1/0306* (2013.01); *H05K 1/115* (2013.01);
(Continued)

(58) Field of Classification Search
CPC ...... H05K 1/0306; H05K 1/115; H05K 1/181; H05K 1/185; H05K 2201/017;
(Continued)

(56) References Cited

U.S. PATENT DOCUMENTS

2005/0016763 A1* 1/2005 Zollo ..................... H05K 1/185
174/256
2006/0054352 A1  3/2006 Ryu et al.
(Continued)

FOREIGN PATENT DOCUMENTS

CN       102119588 A     7/2011
DE   10 2010 011604 A1   9/2011
(Continued)

OTHER PUBLICATIONS

European Search Report for European Patent Application No. 13757377 which corresponds to the above-identified application.
(Continued)

*Primary Examiner* — Yuriy Semenenko
(74) *Attorney, Agent, or Firm* — LRK Patent Law Firm

(57) ABSTRACT

Provided is a printed circuit board, including: a core substrate including an internal circuit pattern on an upper surface or a lower surface; electronic devices which are formed to pass through the core substrate; an external insulating layer which covers the internal circuit pattern and the electronic devices; and an external circuit pattern which is formed on an upper surface of the external insulating layer, wherein a lower surface of the electronic devices protrudes from the lower surface of the core substrate to a lower part. Accordingly, in the embedded printed circuit board in which the electronic devices are embedded, when the electronic devices are mounted, because the insulating layer is formed regardless of a thickness of the electronic devices, the printed circuit board having a desired thickness
(Continued)

regardless of the thickness of the electronic devices can be formed.

9 Claims, 6 Drawing Sheets

(51) Int. Cl.
   *H05K 1/03* (2006.01)
   *H05K 1/11* (2006.01)
   *H05K 3/10* (2006.01)
(52) U.S. Cl.
   CPC ............. *H05K 1/181* (2013.01); *H05K 1/185* (2013.01); *H05K 3/107* (2013.01); *H05K 3/465* (2013.01); *H05K 3/4697* (2013.01); *H05K 2201/017* (2013.01); *H05K 2201/0195* (2013.01); *H05K 2201/20* (2013.01)
(58) Field of Classification Search
   CPC ....... H05K 2201/0195; H05K 2201/20; H05K 3/107; H05K 3/4602; H05K 3/465; H05K 3/4697
   USPC .................................................. 361/760–764
   See application file for complete search history.

(56) References Cited

U.S. PATENT DOCUMENTS

| | | | |
|---|---|---|---|
| 2006/0060960 A1 | 3/2006 | Cho et al. | |
| 2007/0218589 A1* | 9/2007 | Machida | H05K 3/4635 438/113 |
| 2008/0123308 A1* | 5/2008 | Ryu | H05K 1/185 361/762 |
| 2008/0264684 A1* | 10/2008 | Kang | H05K 3/205 174/262 |
| 2009/0237900 A1* | 9/2009 | Origuchi | H01L 23/49838 361/763 |
| 2009/0249618 A1 | 10/2009 | Wang et al. | |
| 2011/0155441 A1 | 6/2011 | Tseng et al. | |
| 2011/0203836 A1 | 8/2011 | Yokota et al. | |
| 2011/0216513 A1* | 9/2011 | Lee | H05K 1/185 361/761 |
| 2013/0039013 A1 | 2/2013 | Waegli et al. | |

FOREIGN PATENT DOCUMENTS

| | | |
|---|---|---|
| EP | 2357877 A1 | 8/2011 |
| JP | 2011-216740 A | 10/2011 |
| KR | 10-2011-0006525 A | 1/2011 |
| KR | 10-1056156 B1 | 8/2011 |
| KR | 10-1084252 B1 | 11/2011 |

OTHER PUBLICATIONS

TIPO Office Action for Taiwanese Patent Application No. 102107595 which corresponds to the above-identified U.S. application.

Search Report for International Application No. PCT/KR2013/001477.

* cited by examiner

PRINTED CIRCUIT BOARD AND METHOD OF MANUFACTURING THE SAME

TECHNICAL FIELD

The present invention relates to a printed circuit board and a method of manufacturing the same.

This application claims priority to Korean Patent Application No. 10-2012-0023253, filed on Mar. 7, 2012, in the Korean Intellectual Property Office, the entire contents of which are hereby incorporated by reference.

BACKGROUND ART

A printed circuit board (PCB) is formed by printing a circuit line pattern on an electrical insulating substrate with a conductive material such as Cu and means a board just before electronic components are mounted. That is, it means a circuit board, which is configured such that to closely mount various kinds of electronic devices on a flat board, a mounting position of each component is fixed, and the circuit board is fixed by printing the circuit pattern for connecting the components on a surface of the flat board.

Recently, an embedded printed circuit board, which is configured such that each component is embedded and mounted in the printed circuit board, has been provided.

FIG. 1 illustrates a conventional embedded printed circuit board.

Referring to FIG. 1, a conventional embedded printed circuit board 10 is configured such that an electronic device 5 is embedded between a plurality of insulating layers 1, and an embedded circuit pattern 2 which causes conduction between the plurality of insulating layers 1 and a via hole for connecting circuits of different layers from each other are formed.

The above embedded electronic device 5 is configured such that a solder or a buffer 6 is formed below the electronic device 5, below the solder or the buffer 6, a pad 7 to be connected to an external circuit pattern 9 is included, and a via 8 for connecting the pad 7 and the external circuit pattern 9 is formed.

Like this, in a case where the electronic device 5 is mounted in an inner part, the electronic device 5 is formed to have a smaller thickness than a thickness of the insulating layer. Thus, a size of the electronic device 5 to be mounted has a limitation, and to mount the electronic device, a printed circuit board having a thicker thickness is formed.

DISCLOSURE OF INVENTION

Technical Problem

An aspect of the present invention provides a method of manufacturing an embedded printed circuit board which can be mounted regardless of a size of an electronic device.

Solution to Problem

According to an aspect of the present invention, there is provided a printed circuit board including: a core substrate including an internal circuit pattern in an upper surface or a lower surface; an electronic device formed to pass through the core substrate; an external insulating layer which covers the internal circuit pattern and the electronic device; and an external circuit pattern formed on an upper surface of the external insulating layer, wherein a lower surface of the electronic device protrudes from the lower surface of the core substrate to a lower part.

According to another aspect of the present invention, there is provided a method of manufacturing a printed circuit board, the method including: forming a core substrate including an internal circuit pattern formed on an upper surface or a lower surface and having a first thickness; forming a first adhesive layer in a lower part of the core substrate; forming a cavity which passes through the core substrate and the first adhesive layer; forming a second adhesive layer on a lower surface of the first adhesive layer; disposing an electronic device on the second adhesive layer exposed to the cavity; forming an upper insulating layer in an upper part of the core substrate; removing the first and the second adhesive layers; and forming a lower insulating layer in a lower part of the core substrate.

Advantageous Effects of Invention

According to the present invention, in the embedded printed circuit board in which the electronic device is embedded, when the electronic device is mounted, because the insulating layer is formed regardless of a thickness of the electronic device, the printed circuit board having a desired thickness regardless of the thickness of the electronic device can be formed.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

BEST MODE FOR CARRYING OUT THE INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein. Rather, these embodiments are provided so that this disclosure will be thorough and complete, and will fully convey the scope of the present invention to those skilled in the art. The terminology used herein is for the purpose of describing particular embodiments only and is not intended to be limiting of example embodiments.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

To clearly explain the present invention, the parts which have no relation with the explanation are omitted, and to clearly express various layers and areas, their thicknesses are enlarged. Also, like numbers may refer to like elements throughout the description of the figures.

When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle.

The present invention provides a printed circuit board having a uniform thickness regardless of the thickness of electronic devices 200 with respect to the embedded printed circuit board in which the electronic devices 200 is embedded and mounted.

Hereinafter, the printed circuit board according to an exemplary embodiment of the present invention will be explained with reference to FIG. 2 to FIG. 11.

Figure 1:
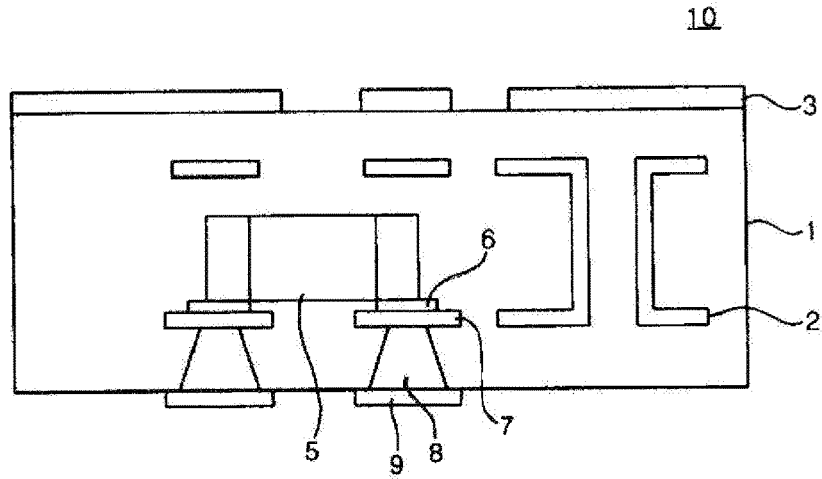
FIG. 1 is a cross-sectional view showing a printed circuit board according to a conventional art.
Figure 2:
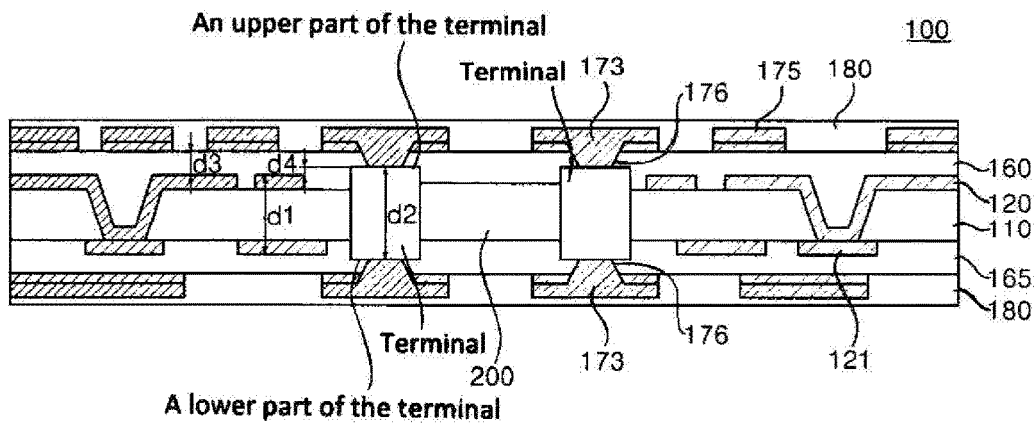
FIG. 2 is a cross-sectional view showing a printed circuit board according to an exemplary embodiment of the present invention.

FIG. 2 is a cross-sectional view showing a printed circuit board according to an exemplary embodiment of the present invention.

Referring to FIG. 2, a printed circuit board 100 according to the present exemplary embodiment of the invention includes: a first insulating layer 110; an internal circuit pattern 121 formed on and below the first insulating layer 110; a second insulating layer 160 and a third insulating layer 165 which are formed in an upper part and a lower part of the first insulating layer 110; an external circuit pattern 175 and a cover lay 180 formed on the second insulating layer 160 and the third insulating layer 165; a plurality of electronic devices 200 which are embedded in the printed circuit board 100.

The first to third insulating layers 110, 160, 165 may form an insulating plate and may be a thermosetting or thermoplastic polymer substrate, a ceramic substrate, organic-inorganic composite material substrate or a glass fiber-impregnated substrate. In a case where the layers include a polymer resin, an epoxy-based insulating resin may be included therein. Unlike this, a polyimide-based resin may be included therein.

The first to third insulating layers 110, 160, 165 may be formed of different materials from each other. As one example, the first insulating layer 110 may be a glass fiber-impregnated substrate, and the second and third insulating layers 160, 165 may be an insulating sheet which is formed of only resin.

A thickness of the first insulating layer 110, which is a central insulating layer, may be thicker than that of the second and third insulating layers 160, 165, and the thickness of the first insulating layer 110 may be smaller than a thickness (d2) of the electronic devices 200.

The thickness of the electronic devices 200 is larger than the sum (d1) of thicknesses of the first insulating layer 110 and the internal circuit pattern 121 of the upper part and lower part. The internal circuit pattern 121 may be formed on a upper surface or a lower surface of the first insulating layer 110 using a laser.

The thickness (d2) of the electronic devices 200 may satisfy less than 220 μm, preferably, 180 to 220 μm.

That is, since the first insulating layer 110 has the smaller thickness (d1) than the electronic devices 200, the electronic devices 200 may protrude as much as a thickness of d4 to an upper part and a lower part of the internal circuit pattern 121. The d4 may satisfy 30 to 35 μm.

The first insulating layer 110 may include an opening for mounting the electronic devices 200. In the upper part and the lower part of the first insulating layer 110, the internal circuit pattern 121 and a conductive via 120 for connecting the internal circuit pattern 121 of the upper part and the lower part may be formed.

The external circuit pattern 175 is formed in an upper part of the second and third insulating layers 160, 165 which are formed in the upper and lower parts of the first insulating layer 110.

The second and third insulating layers 160, 165 may be formed to have a predetermined thickness (d3) from the internal circuit pattern 121, and the thicknesses of the second and third insulating layers 160, 165 may range from 40 to 50 μm.

The second and third insulating layers 160, 165 may have the same thicknesses (d3) as each other. Since the thickness (d4) which the electronic devices 200 protrude is smaller than the thickness of the second and third insulating layers 160, 165, the electronic devices 200 are not exposed to the outside of the second and third insulating layers 160, 165.

A part of the external circuit pattern 175 may be a pad 173 which is connected to a terminal of the electronic devices 200.

A via 176, which passes through the second and third insulating layers 160, 165, is formed between the pad 173 and the electronic devices 200.

The via 176 may be formed only on one surface of the electronic devices 200 or may be formed in both the upper part and the lower part.

The electronic devices 200 embedded by the first to third insulating layers 110, 160, 165 may be a passive device. For example, the electronic devices may be a resistor, an inductor or a capacitor. A terminal for receiving currents or voltages from the outside is formed at both ends of the electronic devices 200.

The pad 173 connected to the via 176 may be extended to an upper surface of the second and third insulating layers 160, 165.

The internal circuit pattern 121 and the external circuit pattern 175 may be formed of an alloy including Cu. The external circuit pattern 175 may be formed as at least two layers.

The external circuit pattern 175 may be protected by the cover lay 180 from the outside.

The cover lay 180 may be formed of a dry film or a general solder resist.

In the above explanation, it is explained that the circuit patterns 121, 175 are formed as two layers. However, unlike this, the circuit patterns may be formed as a plurality of layers.

In the printed circuit board 100, even though the embedded electronic devices 200 protrude because the thickness (d2) of the embedded electronic devices 200 is larger than the sum (d1) of the thicknesses of the first insulating layer 110 and the internal circuit pattern 121, an entire thickness of the printed circuit board 100 is not increased because the electronic devices 200 are embedded in the second and third insulating layers 160, 165.

Hereinafter, a method of manufacturing the printed circuit board 100 of FIG. 2 will be explained with reference to FIG. 3 to FIG. 11.

FIG. 3 through FIG. 11 are cross-sectional views showing a method of manufacturing the printed circuit board 100 according to one exemplary embodiment of the present invention.

Figure 3:
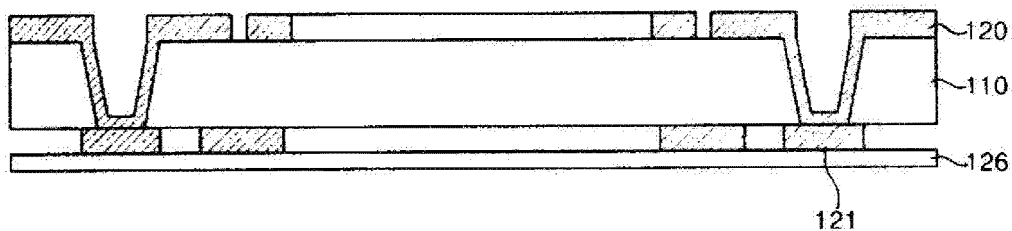
FIG. 3 through FIG. 11 are cross-sectional views showing a method of manufacturing the printed circuit board of FIG. 2.

First, as shown in FIG. 3, a core substrate is prepared.

On the core substrate, the first insulating layer 110 and the internal circuit pattern 121 are formed. The first insulating layer 110 and the internal circuit pattern 121 may be formed from a copper clad laminate (CCL) using an etching process or a plating process.

Also, the internal circuit pattern 121 may be formed using a laser. In a case where the internal circuit pattern 121 is formed using the laser, the first insulating layer 110 may be opened using a YAG laser or a $CO_2$ laser.

A first adhesive layer 126 is adhered to a lower part of the core substrate on which the internal circuit pattern 121 is formed.

A silicon adhesive material having small adhesive strength may be used for the first adhesive layer 126. In consideration of the thickness of the electronic devices to be embedded, a thickness of the first adhesive layer 126 may be determined.

That is, the thickness of the electronic devices which protrude to the lower part of the core substrate may be identical with the thickness of the first adhesive layer 126.

Figure 4:
Figure 5:

Next, a cavity is formed by simultaneously removing the core substrate and the first adhesive layer 126 so that an area in which the electronic devices will be mounted is exposed as shown in FIG. 4.

The removal of the core substrate and the first adhesive layer 126 may be performed using laser drilling. However, unlike this, it may be performed using mechanical punching or drilling.

An area of the removed core substrate may be larger than an area of the electronic devices.

Next, a second adhesive layer 127 is formed in a lower part of the first adhesive layer 126.

The second adhesive layer 127 is exposed to the cavity of the removed core substrate and first adhesive layer 126. Adhesive strength of the second adhesive layer 127 is larger than that of the first adhesive layer 126.

The thickness of the second adhesive layer 127 may satisfy an arbitrary thickness.

Figure 6:
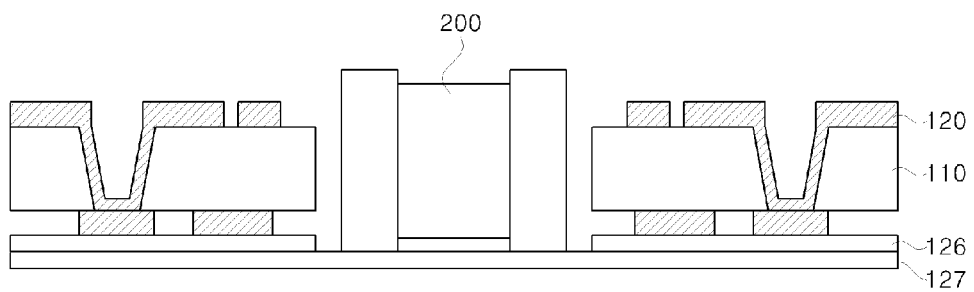

Next, as shown in FIG. 6, the electronic devices are mounted within the cavity.

The electronic devices 200 may be a passive device. For example, the electronic devices may be an inductor or a capacitor. Accordingly, each end of the electronic devices 200 may be located on the same line as the first adhesive layer 126.

Figure 7:
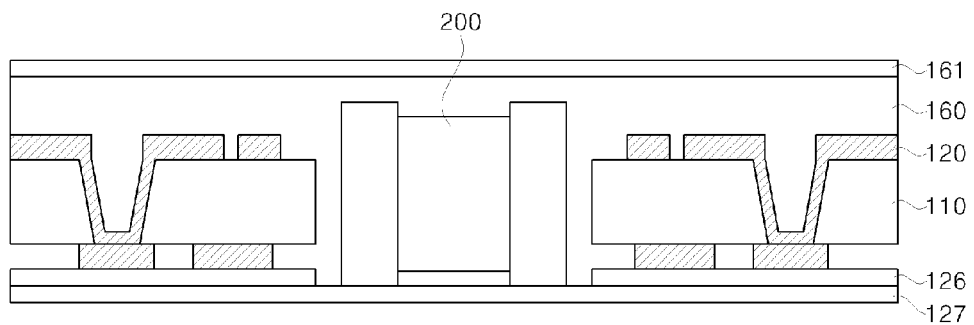

Next, as shown in FIG. 7, the second adhesive layer is adhered onto the core substrate.

That is, the second adhesive layer 160 and a metal layer 161 are laminated on the first insulating layer 110 in a laminated structure, and thereafter, heat and pressure are applied thereto as shown in FIG. 7.

Figure 8:
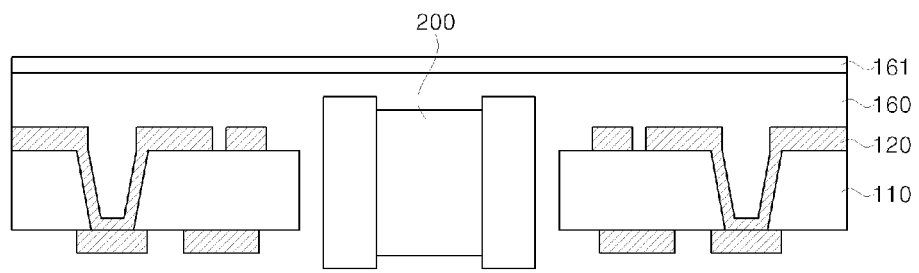

Then, as shown in FIG. 8, a lower surface of the electronic devices 200 is exposed by removing the first and second adhesive layers 126, 127 of the lower part.

Accordingly, the electronic devices 200 located on the same line as the first adhesive layer 126 is formed to protrude from the core substrate.

Figure 9:
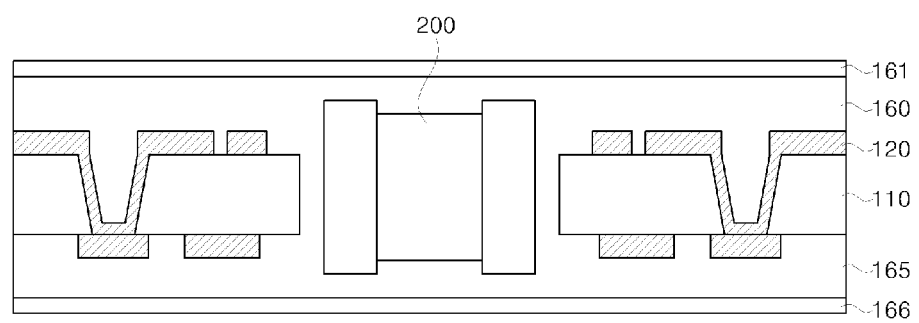

Next, as shown in FIG. 9, the third insulating layer 165 and the second metal layer 166 are laminated in the lower part of the core substrate in a laminated structure, and thereafter heat and pressure are applied thereto. Thus, by hardening the first to third insulating layers 110, 160, 165, one insulating plate is formed, and a state in which the electronic devices 200 are embedded in the insulating plate is maintained.

Figure 10:
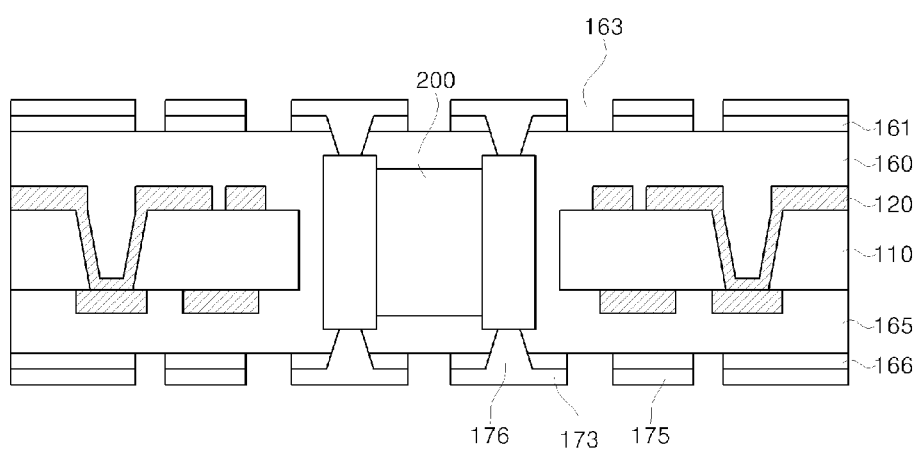

Next, as shown in FIG. 10, a via hole 163 is formed on the first and second metal layers 161, 165 and the second and third insulating layers 160, 165.

A process for forming the via hole 163 may be performed by a physical drill process. Unlike this, a laser may be used. In a case where the via hole 163 is formed using a laser, the first and second metal layers 161, 165 and the second and third insulating layers 160, 165 may be opened, respectively, using a YAG laser or a $CO_2$ laser.

At this time, the formed via hole 163 includes the via hole 163 for opening an upper part and a lower part of the terminal of the electronic devices 200. Along with this, the via hole for electronically connecting the external and internal circuit patterns 121, 175 may be formed even though this is not illustrated.

Next, the via 176 in which the via hole 163 is embedded is formed by performing a plating process. Furthermore, a plated layer which covers the second and third insulating layers 160, 165 is formed, and the external circuit pattern 175 is formed in the upper part of the second and third insulating layers 160, 165 by etching the plated layer.

At this time, the external circuit pattern 175 may include the pad 173 formed on an upper surface of the via 176 in which the via hole is embedded. The pad 173 may include an area extended over the second and third insulating layers 160, 165.

Figure 11:
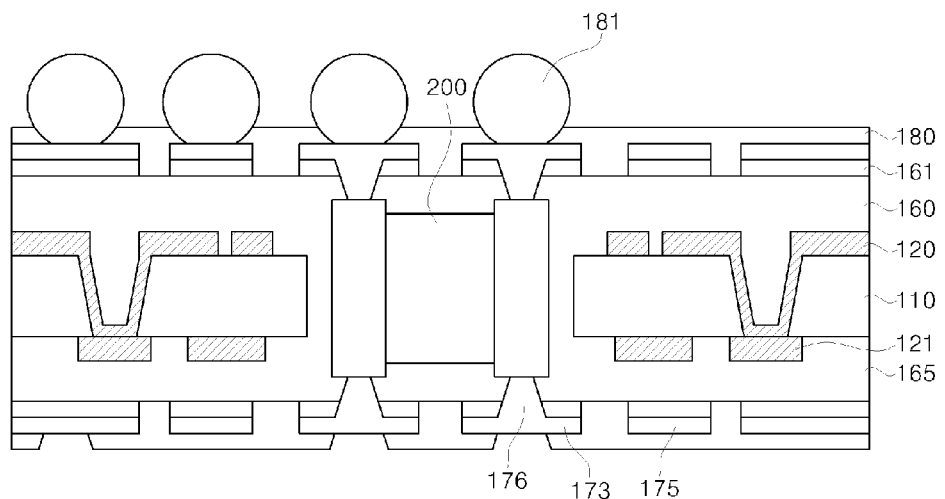

Lastly, after adhering the cover lay 180 in which the circuit pattern 175 is embedded, as shown in FIG. 11, the pad 173 is exposed by etching a part of the cover lay 180, and a solder ball 181 is formed on the exposed pad 173, thereby completing the embedded printed circuit board 100.

In the embedded printed circuit board 100 in which the electronic devices 200 are embedded, when the electronic devices 200 are mounted, two adhesive layers are sequentially formed, and one adhesive layer rewards a thickness difference between the electronic devices and the core substrate. Thus, even in a case where the electronic devices are larger than the core substrate, the thickness of the core substrate is not increased.

Hereinafter, another exemplary embodiment of the present invention will be explained with reference to FIG. 12 to FIG. 18.

Figure 12:
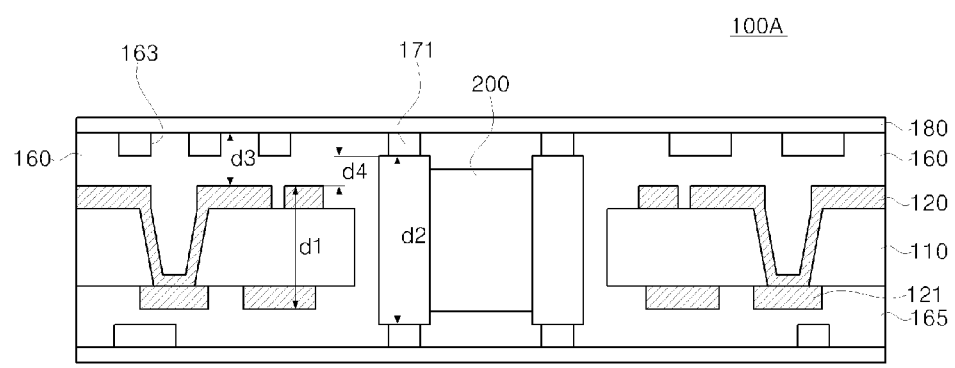
FIG. 12 is a cross-sectional view showing a printed circuit board according to another exemplary embodiment of the present invention.

FIG. 12 is a cross-sectional view showing a printed circuit board according to another exemplary embodiment of the present invention.

Referring to FIG. 12, a printed circuit board 100A according to the present exemplary embodiment of the invention includes: the first insulating layer 110; the internal circuit pattern 121 formed on and below the lower surface of the first insulating layer 110; the second insulating layer 160 and the third insulating layer 165 which are formed in the upper part and the lower part of the first insulating layer 110; the external circuit pattern 171 and the cover lay 180 formed on the surface of the second insulating layer 160 and the third insulating layer 165; and the plurality of electronic devices 200 which are embedded in the printed circuit board 100.

The first to third insulating layers 110, 160, 165 may form an insulating plate and may be a thermosetting or thermoplastic polymer substrate, a ceramic substrate, organic-inorganic composite material substrate or a glass fiber-impregnated substrate. In a case where the layers include a polymer resin, an epoxy-based insulating resin may be included therein. Unlike this, a polyimide-based resin may be included therein.

The first to third insulating layers 110, 160, 165 may be formed of different materials from each other. As one example, the first insulating layer 110 may be a glass fiber-impregnated substrate, and the second and third insulating layers 160, 165 may be an insulating sheet which is formed of only resin.

The first insulating layer 110, which is a central insulating layer, may be thicker than the second and third insulating layers 160, 165, and a thickness of the first insulating layer 110 may be smaller than the thickness (d2) of the electronic devices 200. The thickness (d2) of the electronic devices 200 is larger than the sum (d1) of thicknesses of the first insulating layer 110 and the internal circuit pattern 121 of the upper part and lower part.

That is, since the first insulating layer 110 and the internal circuit pattern 121 has the smaller thickness (d1) than the electronic devices 200, the electronic devices 200 may protrude as much as the thickness of d4 to the upper part and the lower part of the internal circuit pattern 121.

The first insulating layer 110 may include an opening for mounting the electronic devices 200. In the upper part and the lower part of the first insulating layer 110, the internal circuit pattern 121 and the conductive via 120 for connecting the internal circuit pattern 121 of the upper part and the lower part may be formed.

The external circuit pattern 171 is formed on the upper surface of the second and third insulating layers 160, 165, which are formed in the upper and lower parts of the first insulating layer 110.

The second and third insulating layers 160, 165 may be formed to have the predetermined thickness (d3) from the internal circuit pattern 121.

The second and third insulating layers 160, 165 may have the same thicknesses (d3) as each other. Since the thickness of d4 which the electronic devices 200 protrude is smaller than that of the second and third insulating layers 160, 165, the electronic devices 200 are not exposed to the outside of the second and third insulating layers 160, 165.

The second and third insulating layers 160, 165 include the pattern groove 163 for embedding the external circuit pattern 171 on the upper surface.

The pattern groove 163 may be formed so as to maintain a predetermined distance with the internal circuit pattern 121. A part of the pattern groove 163 may be formed as the via hole for applying electric currents to the internal circuit pattern 121 and the external circuit pattern 171.

Also, the pattern groove 163 further includes a terminal groove which exposes the terminal of the electronic devices 200.

The external circuit pattern 171, in which the pattern groove 163 is embedded, is formed.

Among the external circuit pattern 171, a part of the external circuit pattern 171 in which the terminal groove is embedded may function as a pad which is connected to the terminal of the electronic devices 200.

The electronic devices 200 embedded by the first to third insulating layers 110, 160, 165 may be a passive device.

The internal circuit pattern 121 and the external circuit pattern 171 may be formed of an alloy including Cu.

The upper surface of the external circuit pattern 171 may be protected by the cover lay 180 from the outside.

The cover lay 180 may be formed of a dry film or a general solder resist.

In the above explanation, it is explained that the circuit patterns 150, 171 are formed as a single layer. However, unlike this, the circuit patterns may be formed as a plurality of layers.

Hereinafter, a method of manufacturing the printed circuit board 100 of FIG. 2 will be explained with reference to FIG. 13 to FIG. 18.

First, the processes as shown in FIG. 3 to FIG. 6 are performed to be identical with each other.

That is, the electronic devices 200 are mounted in the cavity formed on the first insulating layer 110 and the first adhesive layer 126.

The electronic devices 200 may be a passive device. For example, the electronic devices may be an inductor or a capacitor.

Each end of the electronic devices 200 may be located on the same line as the first adhesive layer 126.

Next, as shown in FIG. 7, the second adhesive layer 160 is adhered onto the core substrate.

Figure 13:
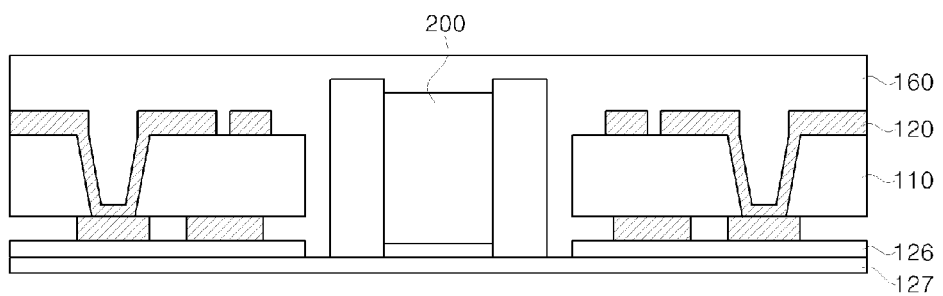
FIG. 13 through FIG. 18 are cross-sectional views showing a method of manufacturing the printed circuit board of FIG. 12.

That is, the second adhesive layer 160 is laminated on the first insulating layer 110, and thereafter, heat and pressure are applied thereto as shown in FIG. 13.

At this time, unlike the first insulating layer 110, the second insulating layer 160 may be a resin material which does not include glass fiber.

Figure 14:
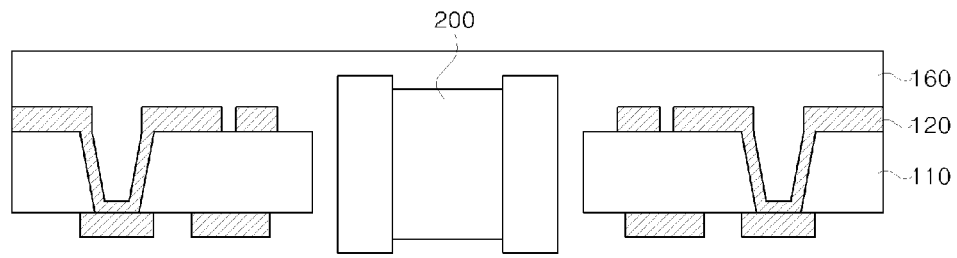

Then, as shown in FIG. 14, the lower surface of the electronic devices 200 is exposed by removing the first and second adhesive layers 126, 127 of the lower part.

Accordingly, the electronic devices 200 located on the same line as the first adhesive layer 126 are formed to protrude from the core substrate.

Figure 15:
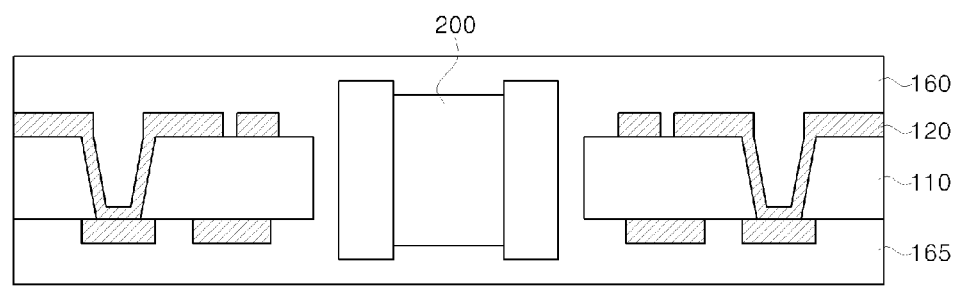

Next, as shown in FIG. 15, the third insulating layer 165 is laminated on the lower part of the core substrate, and thereafter, heat and pressure are applied thereto. Thus, by hardening the first to third insulating layers 110, 160, 165, one insulating plate is formed, and a state in which the electronic devices 200 are embedded in the insulating plate is maintained.

Figure 16:
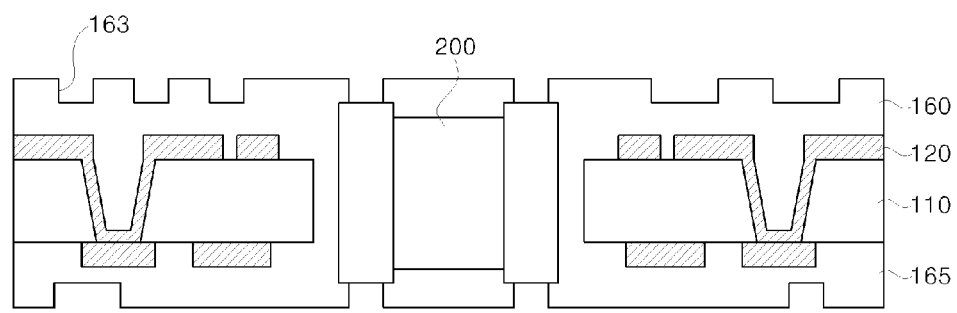

Next, as shown in FIG. 16, the pattern groove 163 is formed on the exposed upper surface of the second and third insulating layers 160, 165.

The pattern groove 163 may be formed using a laser. In a case where the pattern groove 163 is formed using the laser, the groove 163 may be formed on the second and third insulating layers 160, 165 using a YAG laser or a $CO_2$ laser.

At this time, the formed pattern groove 163 includes the terminal groove for opening the upper part and the lower part of the terminal of the electronic devices 200.

Figure 17:
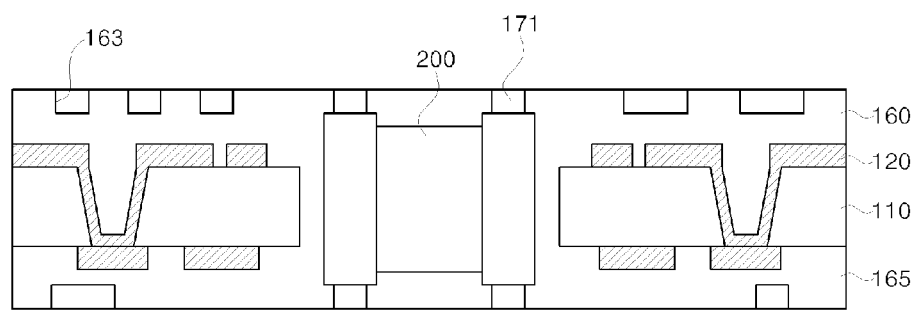

Next, the external circuit pattern 171 in which the pattern groove 163 is embedded is formed by performing a plating process as shown in FIG. 17.

At this time, the external circuit pattern 171 may be formed by applying a conductive material rather than a plating material thereto in a paste shape.

Figure 18:
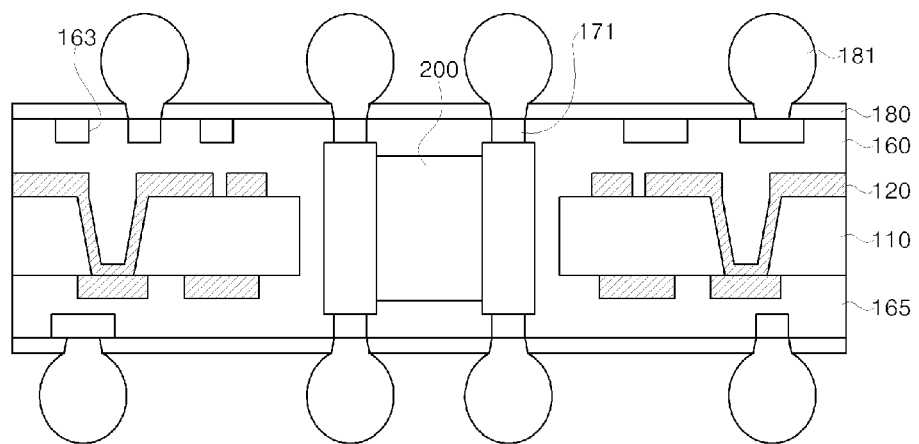

Lastly, as shown in FIG. 18, the embedded printed circuit board 100A is completed by attaching the cover layer 180 in which the circuit pattern 171 is embedded, etching a part of the cover lay 180 so that the pad is exposed, and forming a solder ball 181 on the exposed pad.

In the embedded printed circuit board 100 in which the electronic devices 200 are embedded, when the electronic devices 200 are mounted, two adhesive layers are sequentially formed, and one adhesive layer rewards a thickness difference between the electronic devices and the core substrate. Thus, even in a case where the electronic devices are larger than the core substrate, a thickness of the core substrate may be not increased. Also, since the circuit pattern is formed to be embedded in the insulating layer, the thickness of the printed circuit board can be more reduced.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board comprising:
   a core substrate having a cavity;
   a first internal circuit pattern on an upper surface of the core substrate;
   a second internal circuit pattern on a lower surface of the core substrate;
   an electronic device which is mounted in the cavity to pass through the core substrate;
   an upper insulating layer configured to cover the first internal circuit pattern and the electronic device at an upper part of the core substrate;
   a lower insulating layer configured to cover the second internal circuit pattern and the electronic device at a lower part of the core substrate; and
   an external circuit pattern formed on a surface of the upper insulating layer and a surface of the lower insulating layer,
   wherein a lower surface of the upper insulating layer is in direct contact with an upper surface of the core substrate,
   wherein an upper surface of the lower insulating layer is in direct contact with an lower surface of the core substrate,
   wherein an upper surface of a terminal of the electronic device is positioned at a higher level than an upper surface of the first internal circuit pattern, and positioned at a lower level than an upper surface of the upper insulating layer, and
   wherein a lower surface of the terminal of the electronic device is positioned at a lower level than a lower surface of the second internal circuit pattern, and positioned at a higher level than a lower surface of the lower insulating layer.

2. The printed circuit board of claim 1, wherein the electronic device has a larger thickness than that of the core substrate.

3. The printed circuit board of claim 1, wherein the external circuit pattern is formed to protrude from the upper and lower insulating layers.

4. The printed circuit board of claim 1,
   wherein the upper surface of the terminal is covered by the upper insulating layer, and
   wherein the lower surface of the terminal is covered by the lower insulating layer.

5. The printed circuit board of claim 1, wherein the core substrate comprises a glass fiber-impregnated resin material.

6. The printed circuit board of claim 1, wherein the upper and lower insulating layers comprise a glass fiber-impregnated resin material.

7. The printed circuit board of claim 1, wherein the first and internal circuit patterns are formed on the upper surface and the lower surface of the core substrate using a laser.

8. The printed circuit board of claim 1, wherein the external circuit pattern is formed by forming a copper foil layer in the upper and lower insulating layers and plating the copper foil layer with a seed.

9. The printed circuit board of claim 1, further comprising a cover lay intended for protecting the external circuit pattern.

* * * * *